(12) United States Patent
Bong et al.

(10) Patent No.: US 12,218,204 B2
(45) Date of Patent: Feb. 4, 2025

(54) SEMICONDUCTOR DEVICE

(71) Applicant: SUZHOU LEKIN SEMICONDUCTOR CO., LTD., Taicang (CN)

(72) Inventors: Ha Jong Bong, Seoul (KR); Jae Gu Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 373 days.

(21) Appl. No.: 16/768,401

(22) PCT Filed: Nov. 30, 2018

(86) PCT No.: PCT/KR2018/015146
§ 371 (c)(1),
(2) Date: May 29, 2020

(87) PCT Pub. No.: WO2019/108038
PCT Pub. Date: Jun. 6, 2019

(65) Prior Publication Data
US 2020/0321440 A1 Oct. 8, 2020

(30) Foreign Application Priority Data
Dec. 1, 2017 (KR) .................. 10-2017-0164483

(51) Int. Cl.
*H01L 29/205* (2006.01)
*H01L 29/20* (2006.01)
(Continued)

(52) U.S. Cl.
CPC ........ *H01L 29/205* (2013.01); *H01L 29/2003* (2013.01); *H01L 29/207* (2013.01);
(Continued)

(58) Field of Classification Search
CPC .. H01L 29/205; H01L 29/2003; H01L 29/207
See application file for complete search history.

(56) References Cited

U.S. PATENT DOCUMENTS

| 6,153,894 A | 11/2000 | Udagawa |
| 6,677,619 B1 * | 1/2004 | Nagahama ............. H01L 33/32 |
| | | 251/200 |

(Continued)

FOREIGN PATENT DOCUMENTS

| JP | 2000-150957 A | 5/2000 |
| KR | 10-2014-0018985 A | 2/2014 |

(Continued)

OTHER PUBLICATIONS

Dopant monitoring in LED devices (SIMS), CAMECA (2017).*
(Continued)

*Primary Examiner* — Jay C Kim
(74) *Attorney, Agent, or Firm* — Birch, Stewart, Kolasch & Birch, LLP

(57) ABSTRACT

Disclosed in an embodiment is a semiconductor device comprising a semiconductor structure, which comprises a first conductive semiconductor layer, a second conductive semiconductor layer, and an active layer disposed between the first conductive semiconductor layer and the second conductive semiconductor layer, wherein: the first conductive semiconductor layer comprises a first super lattice layer comprising a plurality of first sub layers and a plurality of second sub layers, the first and second sub layers being alternately arranged; the semiconductor structure emits ions of indium, aluminum, and a first and second dopant during a primary ion irradiation; the intensity of indium ions emitted from the active layer includes a maximum indium intensity peak; the doping concentration of the first dopant emitted from the first conductive semiconductor layer includes a maximum concentration peak; the maximum
(Continued)

indium intensity peak is disposed to be spaced from the maximum concentration peak in a first direction; the intensity of indium ions emitted from the plurality of first sub layers has a plurality of first indium intensity peaks; the doping concentration of the first dopant emitted from the plurality of first sub layers has a plurality of first concentration peaks; and the plurality of first indium intensity peaks and the plurality of first concentration peaks are disposed between the maximum indium intensity peak and the maximum concentration peak.

12 Claims, 6 Drawing Sheets

(51) Int. Cl.
*H01L 29/207* (2006.01)
*H01L 33/32* (2010.01)
*H01S 5/30* (2006.01)
*H01S 5/323* (2006.01)

(52) U.S. Cl.
CPC .......... *H01L 33/325* (2013.01); *H01S 5/3086* (2013.01); *H01S 5/323* (2013.01)

(56) References Cited

U.S. PATENT DOCUMENTS

| | | | | |
|---|---|---|---|---|
| 7,042,019 B1* | 5/2006 | Wu | ............... | B82Y 20/00 257/E33.005 |
| 7,160,748 B2* | 1/2007 | Ishibashi | ............ | H01L 21/0254 438/45 |
| 7,183,584 B2* | 2/2007 | Futagawa | ............. | B82Y 20/00 257/14 |
| 7,288,797 B2* | 10/2007 | Deguchi | ................. | H01L 33/38 257/E33.034 |
| 7,576,363 B2* | 8/2009 | Uemura | ................. | B82Y 20/00 257/101 |
| 7,781,791 B2* | 8/2010 | Sakai | ...................... | H01L 33/22 257/E33.001 |
| 8,247,792 B2* | 8/2012 | Kim | ......................... | H01L 33/04 257/14 |
| 8,294,178 B2* | 10/2012 | Koo | .......................... | H01L 33/14 257/101 |
| 8,338,820 B2* | 12/2012 | Kikuchi | ................... | H01L 33/04 257/98 |
| 8,357,924 B2* | 1/2013 | Kim | ..................... | H01L 33/0025 257/94 |
| 8,358,673 B2* | 1/2013 | Bhat | ................. | H01S 5/320275 372/45.01 |
| 8,426,844 B2* | 4/2013 | Moon | ..................... | H01L 33/04 257/14 |
| 8,536,615 B1* | 9/2013 | Driscoll | ............ | H01L 21/02458 257/101 |
| 8,575,592 B2* | 11/2013 | Bergmann | .............. | H01L 33/04 257/13 |
| 8,633,469 B2* | 1/2014 | Nakamura | ............ | H01L 33/325 257/101 |
| 8,658,441 B2* | 2/2014 | Bando | ..................... | H01L 33/38 438/22 |
| 8,866,127 B2* | 10/2014 | Takahashi | ......... | H01L 21/02507 257/14 |
| 8,885,681 B2* | 11/2014 | Takado | ............... | H01S 5/04253 372/45.012 |
| 8,896,085 B2* | 11/2014 | Sakai | .................... | H01L 33/007 257/478 |
| 8,946,764 B2* | 2/2015 | Biwa | ...................... | H01L 33/32 257/101 |
| 8,980,657 B2* | 3/2015 | Boyama | ............ | H01L 21/02505 257/85 |
| 9,048,385 B2* | 6/2015 | Sanga | ...................... | H01L 33/02 |
| 9,070,805 B2* | 6/2015 | Fudeta | .................... | H01L 33/04 |
| 9,076,896 B2* | 7/2015 | Choi | .................. | H01L 33/0075 |
| 9,087,946 B2* | 7/2015 | Lin | .......................... | H01L 33/04 |
| 9,099,600 B2* | 8/2015 | Choi | ....................... | H01L 33/14 |
| 9,166,102 B2* | 10/2015 | Okuno | ................... | H01L 33/06 |
| 9,312,433 B2* | 4/2016 | Han | ........................ | H01L 33/04 |
| 9,705,032 B2* | 7/2017 | Shur | ....................... | H01L 33/06 |
| 10,069,035 B2* | 9/2018 | Park | ...................... | H01L 33/145 |
| 10,109,767 B2* | 10/2018 | Kim | ...................... | H01L 33/06 |
| 11,081,346 B2* | 8/2021 | Charles | ............ | H01L 21/02551 |
| 2006/0192207 A1* | 8/2006 | Wook Shim | ............ | H01L 33/14 257/79 |
| 2007/0045655 A1* | 3/2007 | Song | ....................... | H01L 33/04 257/104 |
| 2009/0001402 A1* | 1/2009 | Sakai | .................... | H01L 33/641 438/46 |
| 2010/0123119 A1* | 5/2010 | Kim | ....................... | H01L 33/06 257/14 |
| 2013/0032834 A1 | 2/2013 | Chen | | |
| 2017/0025568 A1 | 1/2017 | Ji et al. | | |

FOREIGN PATENT DOCUMENTS

| | | |
|---|---|---|
| KR | 10-2016-0013553 A | 2/2016 |
| KR | 10-1622097 B1 | 5/2016 |
| KR | 10-2017-0012783 A | 2/2017 |

OTHER PUBLICATIONS

Young et al., "Calcium impurity as a source of non-radiative recombination in (In,Ga)N layers grown by molecular beam epitaxy," Applied Physics Letters 109 (2016) 212103.*

Wu et al., "Effects of the number of wells on the performance of green InGaN/GaN LEDs with V-shape pits grown on Si substrates," Superlattices and Microstructures 114 (2018) pp. 89-96.*

* cited by examiner

[FIG. 1]
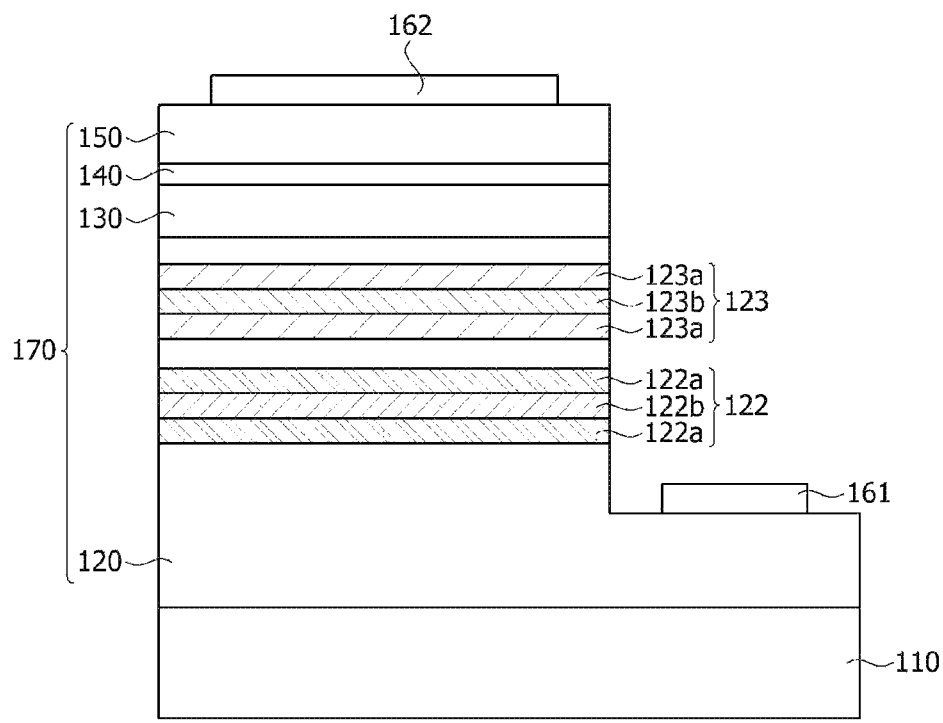
[FIG. 2]
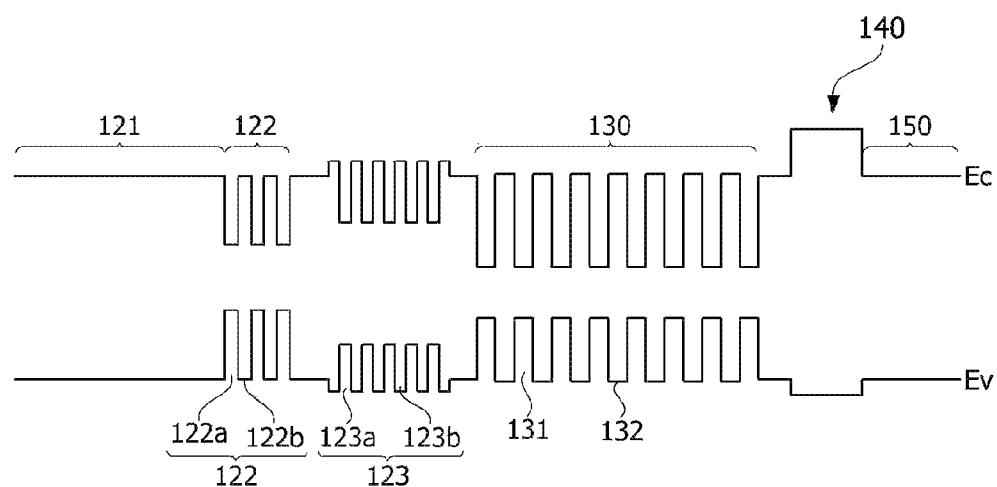

[FIG. 3]
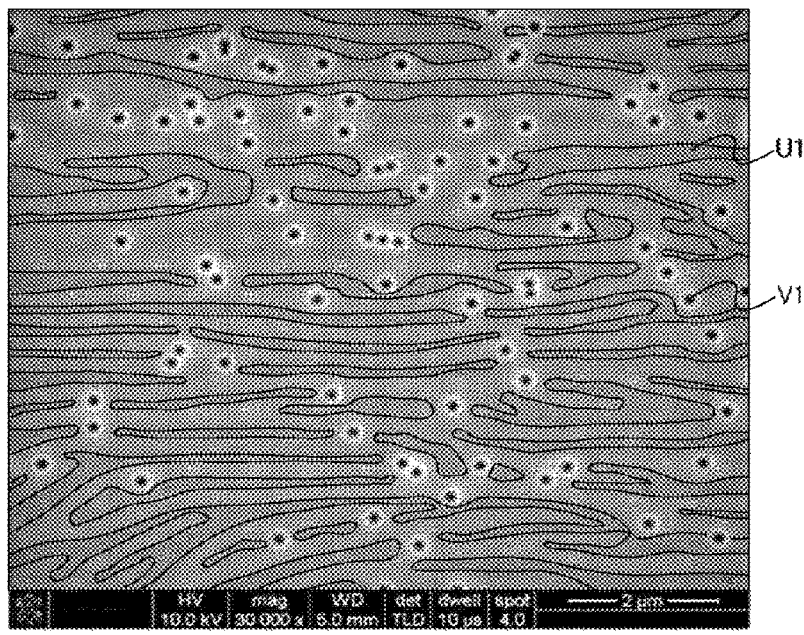
[FIG. 4]
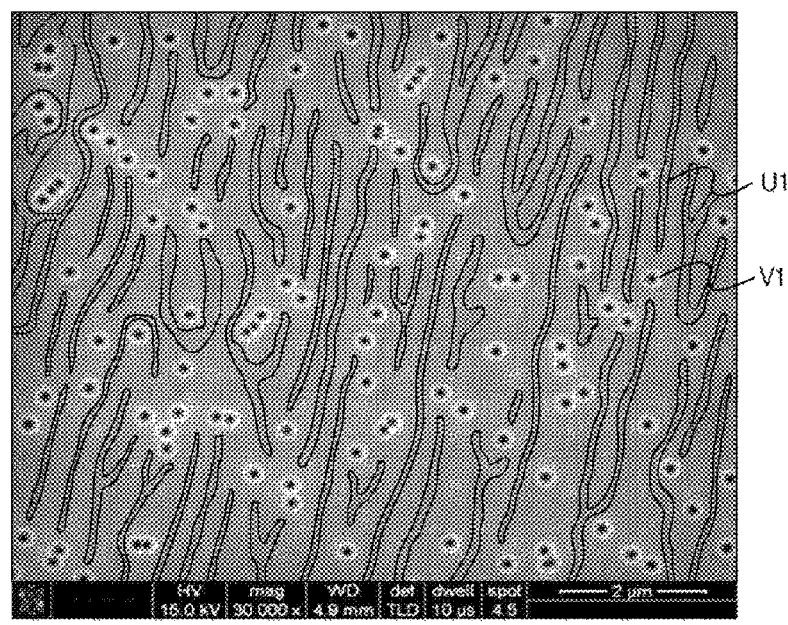

[FIG. 5]
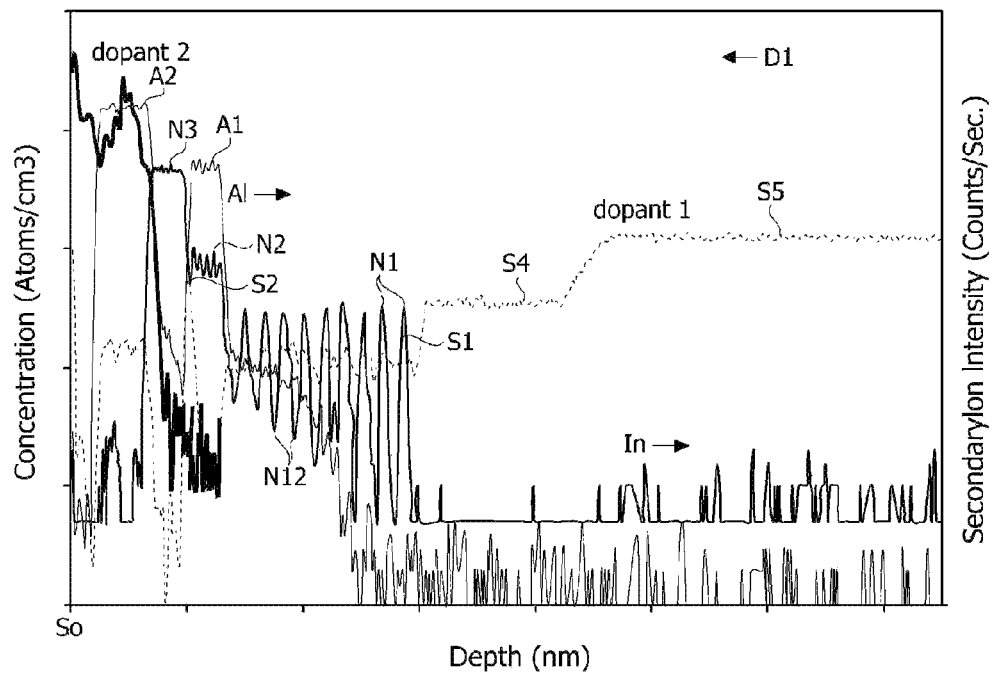
[FIG. 6]
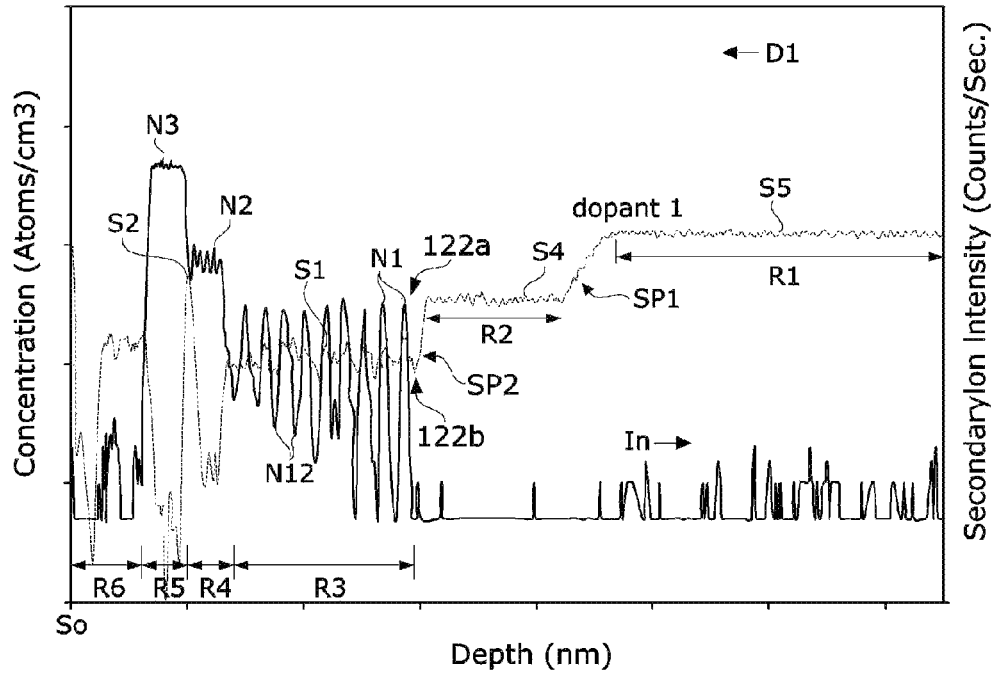

[FIG. 7]
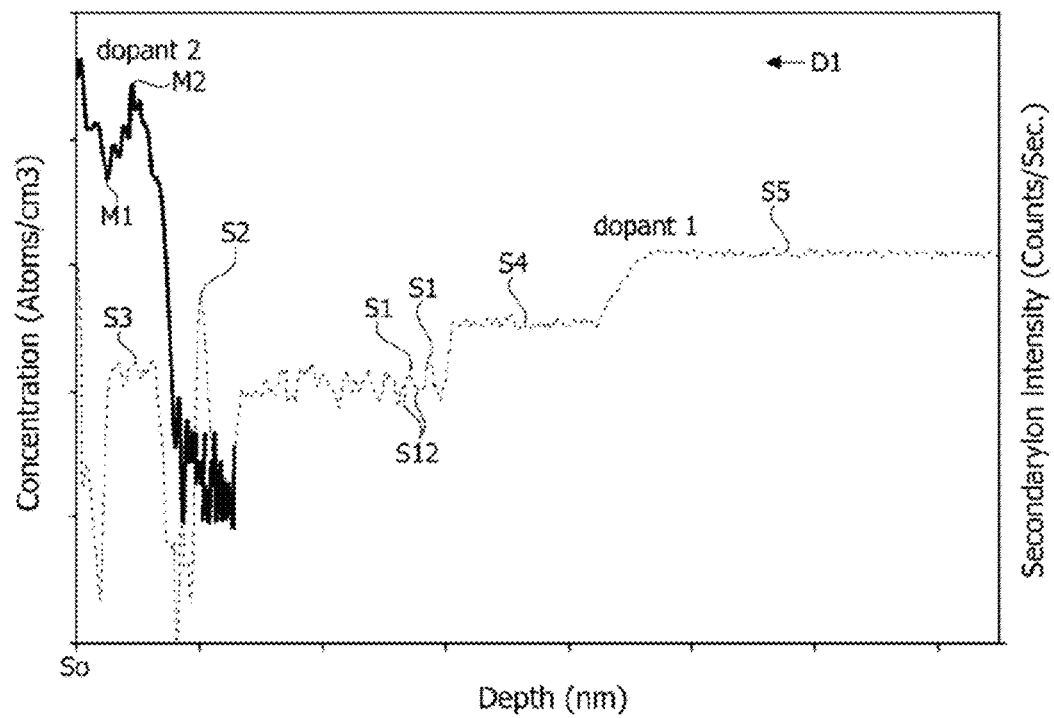
[FIG. 8]
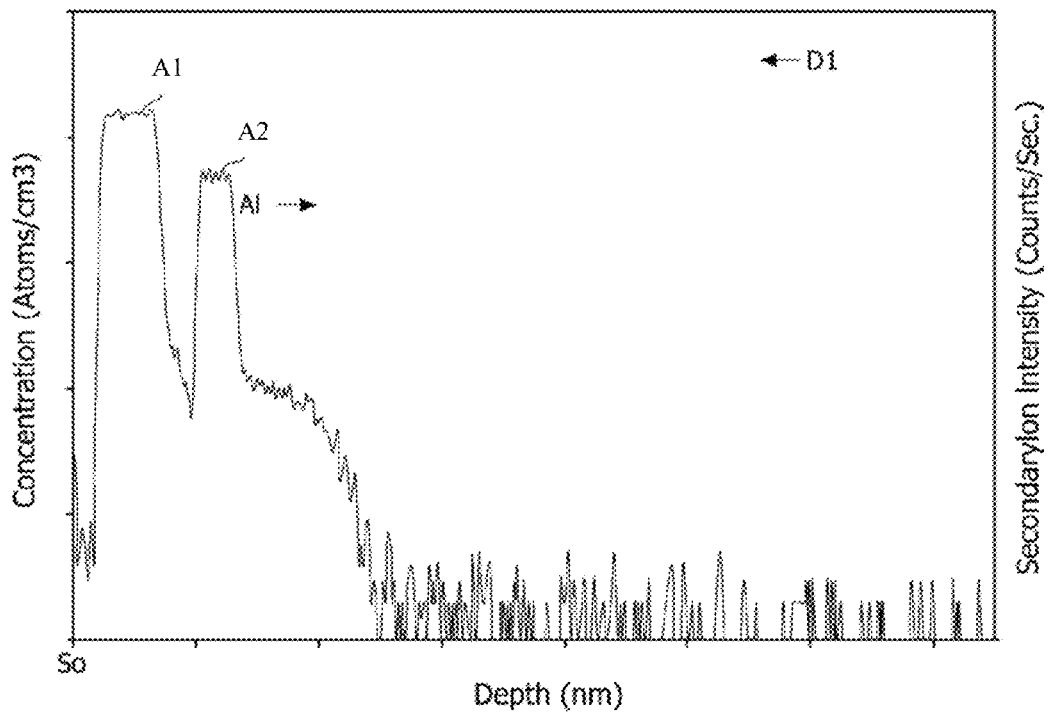

[FIG. 9]
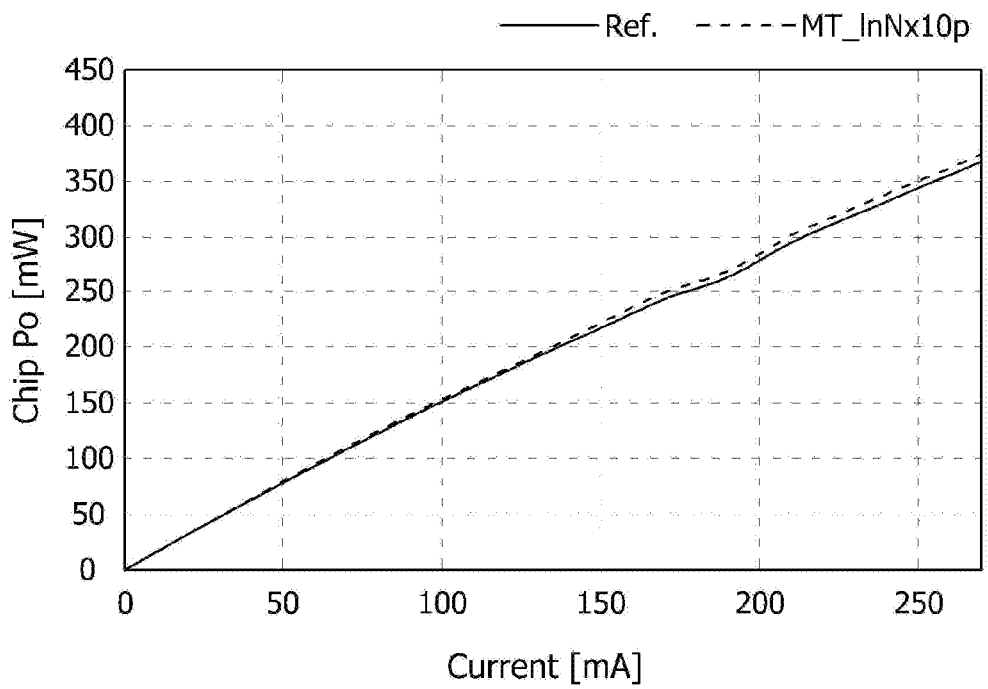
[FIG. 10]
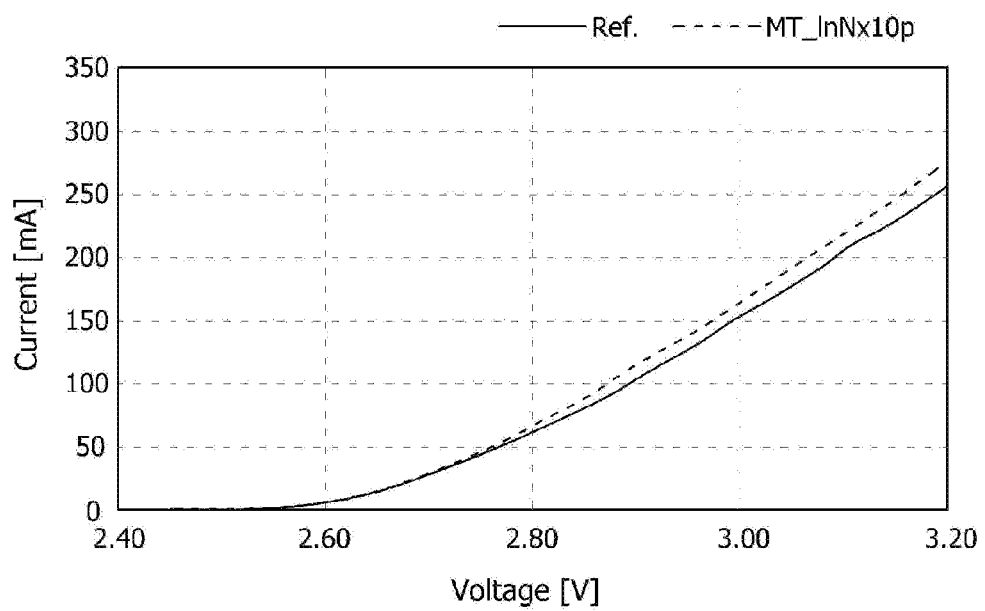

[FIG. 11]
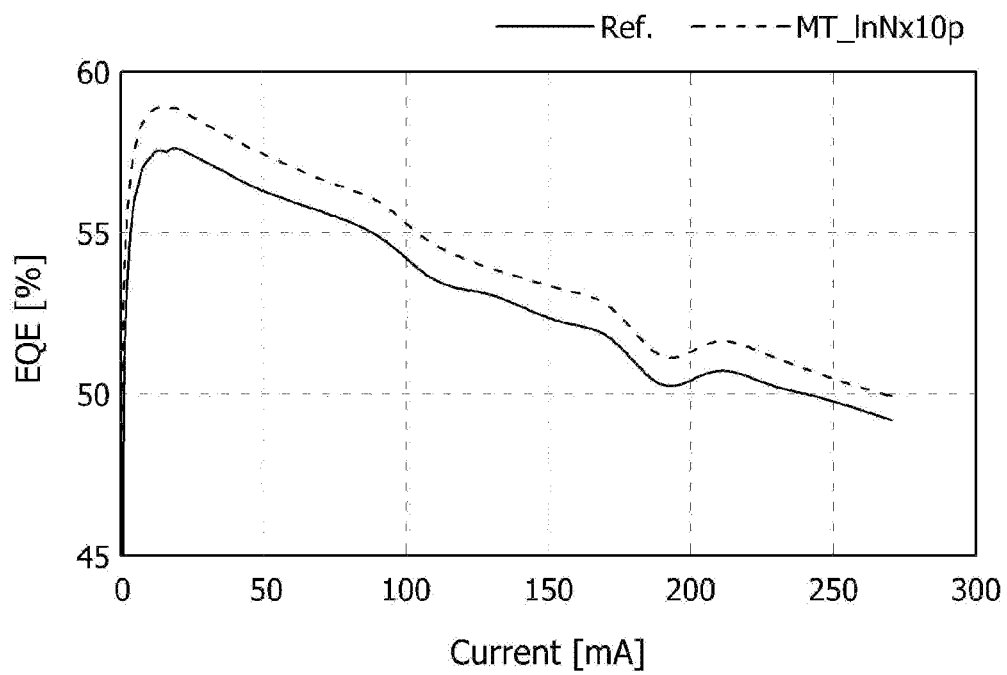
[FIG. 12]
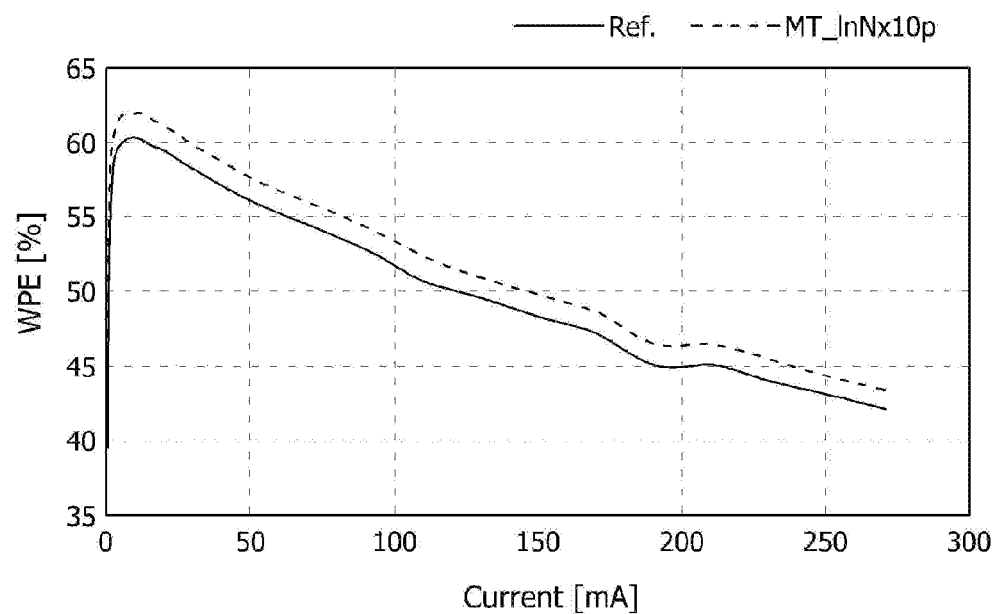

SEMICONDUCTOR DEVICE

CROSS REFERENCE TO RELATED APPLICATIONS

This application is the National Phase of PCT International Application No. PCT/KR2018/015146, filed on Nov. 30, 2018, which claims priority under 35 U.S.C. 119 (a) to Patent Application No. 10-2017-0164483, filed in the Republic of Korea on Dec. 1, 2017, all of which are hereby expressly incorporated by reference into the present application.

TECHNICAL FIELD

An embodiment relates to a semiconductor device.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or a laser diode, using a III-V group or II-VI group compound semiconductor material can realize various colors, such as red, green, blue, or ultraviolet light due to the development of thin-film growth technology and device materials. Also, the light-emitting device can realize efficient white light by using a fluorescent material or combining colors and has the advantages of low power consumption, semi-permanent lifetime, high response speed, safety, and environmental friendliness as compared to existing light sources such as fluorescent lamps and incandescent lamps.

Moreover, due to the development of device materials, when a light-receiving device, such as a photodetector or a solar cell, is fabricated using a III-V group or II-VI group compound semiconductor material, the light-receiving device generates a photocurrent by absorbing light in various wavelength regions, and thus it is possible to use light in various wavelength regions from a gamma-ray region to a radio-wave region. Also, the light-receiving device has the advantages of fast response time, safety, environmental friendliness, and ease of adjustment of device materials and thus may be easily used for power control or ultra-high frequency circuits or communication modules.

Therefore, the applications of semiconductor devices are being expanded to transmission modules of optical communication means, light-emitting diode backlights which replace cold cathode fluorescence lamps (CCFLs) constituting the backlights of liquid crystal display (LCD) devices, white light-emitting diode lighting devices which may replace fluorescent lamps or incandescent lamps, vehicle headlights, traffic lights, sensors for sensing gas or fire, and the like. Also, the applications of semiconductor devices may be expanded to high-frequency application circuits, other power control devices, and communication modules.

However, in a conventional semiconductor device, the surface of a semiconductor layer may be roughened so that excessive stress may be applied to an active layer. Thus, there are problems in that electrical and optical characteristics are deteriorated.

DISCLOSURE

Technical Problem

An embodiment is directed to providing a semiconductor device in which a surface roughness of an active layer is improved.

An embodiment is also directed to providing a semiconductor device with improved optical power.

An embodiment is also directed to providing a semiconductor device with improved current spreading efficiency.

Objectives to be solved by embodiments of the present invention are not limited to the above-described objectives and will include objectives and effects which can be identified by solutions for the objectives and the embodiments described below.

Technical Solution

One aspect of the present invention provides a semiconductor device including a semiconductor structure including a first conductive semiconductor layer, a second conductive semiconductor layer, and an active layer disposed between the first conductive semiconductor layer and the second conductive semiconductor layer, wherein the first conductive semiconductor layer includes a first superlattice layer including a plurality of first sub layers and a plurality of second sub layers, which are alternately disposed, the semiconductor structure emits ions of indium, aluminum, a first dopant, and a second dopant when primary ions are irradiated thereon, an intensity of the indium ions emitted from the plurality of first sub layers has a plurality of first indium intensity peaks, and a doping concentration of the first dopant emitted from the plurality of first sub layers has a plurality of first concentration peaks.

An intensity of the indium ions emitted from the active layer may include a maximum indium intensity peak, a doping concentration of the first dopant emitted from the first conductive semiconductor layer may include a maximum concentration peak, and the maximum indium intensity peak may be disposed to be spaced apart from the maximum concentration peak in a first direction.

The plurality of first indium intensity peaks and the plurality of first concentration peaks may be disposed between the maximum indium intensity peak and the maximum concentration peak.

An intensity of the indium ions emitted from the plurality of second sub layers may have a plurality of first valleys, and a doping concentration of the first dopant emitted from the plurality of second sub layers may have a plurality of second valleys.

The first valleys may increase in intensity as it approaches the maximum indium intensity peak.

The first conductive semiconductor layer may include a second superlattice layer disposed between the active layer and the first superlattice layer, the second superlattice layer may include a plurality of third sub layers and a plurality of fourth sub layers, which are alternately disposed, and an intensity of the indium ions emitted from the third sub layers may have a second indium intensity peak higher than the first indium intensity peak.

The second indium intensity peak may be disposed between the maximum indium intensity peak and the first indium intensity peak.

The doping concentration of the first dopant may include a second concentration peak and a third concentration peak that are disposed to be spaced apart from the first concentration peak in the first direction, and the second concentration peak and the third concentration peak may be higher than the first concentration peak.

The second concentration peak may be higher than the third concentration peak.

The second concentration peak may be disposed between the second indium intensity peak and the maximum indium intensity peak.

The first dopant may include a fourth concentration peak disposed to be spaced apart in a direction opposite to the first direction, and the fourth concentration peak may be disposed between the maximum concentration peak and the first concentration peak.

The first dopant may further include a fifth concentration peak disposed to be spaced apart in a direction opposite to the first direction, and the fifth concentration peak may be higher than the first to fourth concentration peaks.

The fourth concentration peak may be higher than the first concentration peak.

An intensity of the aluminum ions may include a first aluminum intensity peak having the highest ion intensity and a second aluminum intensity peak disposed to be spaced apart from the first aluminum intensity peak in a direction opposite to the first direction.

The maximum indium intensity peak may be disposed between the first aluminum intensity peak and the second aluminum intensity peak.

The second indium intensity peak and the second aluminum intensity peak may be disposed at the same position.

The first sub layers may include InN, and the second sub layers include GaN.

The first sub layers may have a thickness of 2 nm to 4 nm, and the second sub layers may have a thickness of 20 nm to 40 nm.

The first sub layers and the second sub layers may all include InGaN.

A composition of InGaN in the first sub layers and a composition of InGaN in the second sub layers may be different from each other.

Advantageous Effects

According to one embodiment of the present invention, a surface roughness of a semiconductor layer can be improved and thus optical power and/or current spreading efficiency can be improved.

Various advantages and effects of the present invention are not limited to the above description and can be more easily understood during the description of specific exemplary embodiments of the present invention.

DESCRIPTION OF DRAWINGS

FIG. 1 is a conceptual diagram of a semiconductor device according to one embodiment of the present invention.

FIG. 2 is a diagram illustrating an energy bandgap of the semiconductor device according to one embodiment of the present invention.

FIG. 3 is a view illustrating a surface roughness of a conventional semiconductor device.

FIG. 4 is a view illustrating a surface roughness of the semiconductor device according to one embodiment of the present invention.

FIG. 5 illustrates secondary-ion mass spectrometry (SIMS) data of the semiconductor device according to one embodiment of the present invention.

FIG. 6 is a view illustrating an ion intensity of each of a first dopant and indium.

FIG. 7 is a view illustrating a doping concentration of each of the first dopant and a second dopant.

FIG. 8 is a view illustrating an ion intensity of aluminum.

FIG. 9 is a graph obtained by measuring optical power of the semiconductor device according to one embodiment of the present invention.

FIG. 10 is a graph obtained by measuring voltage and current applied to the semiconductor device according to one embodiment of the present invention.

FIG. 11 is a graph obtained by measuring external light extraction efficiency of the semiconductor device according to one embodiment of the present invention.

FIG. 12 is a graph obtained by measuring wall-plug efficiency (WPE) of the semiconductor device according to one embodiment of the present invention.

MODES OF THE INVENTION

The present embodiments may be modified in other forms, or several embodiments may be combined with one another, and the scope of the present invention is not limited to each of the embodiments described below.

Even when content described in a specific embodiment is not described in other embodiments, the content may be understood as being related to other embodiments unless described otherwise or the content contradicts a specific embodiment in the other embodiments.

For example, when features of component A are described in a specific embodiment and features of component B are described in another embodiment, it should be understood that embodiments in which component A is combined with component B fall within the scope and spirit of the present invention even when they are not explicitly described, unless there is an opposing or contradictory explanation.

In the description of the embodiments, when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Hereinafter, embodiments of the present invention will be described in detail with reference to the accompanying drawings so that those of ordinary skill in the art can easily implement them.

FIG. 1 is a conceptual diagram of a semiconductor device according to one embodiment of the present invention, FIG. 2 is a diagram illustrating an energy bandgap of the semiconductor device according to one embodiment of the present invention, FIG. 4 is a view illustrating a surface roughness of the semiconductor device according to one embodiment of the present invention, and FIG. 3 is a view illustrating a surface roughness of a conventional semiconductor device.

Referring to FIGS. 1 to 2, the semiconductor device according to the embodiment may include a substrate 110, a semiconductor structure 170 disposed on the substrate 110, and a first electrode 161 and a second electrode 162 that are disposed on the semiconductor structure 170.

The substrate 110 may include a conductive substrate or an insulating substrate. The substrate 110 may be a material suitable for growing a semiconductor material or may be a carrier wafer. The substrate 110 may be made of a material selected from the group consisting of sapphire ($Al_2O_3$), SiC, GaAs, GaN, ZnO, Si, GaP, InP, and Ge, but the present invention is not limited thereto.

A first conductive semiconductor layer 120 may be implemented with a compound semiconductor including a III-V group element, a II-VI group element, or the like and may be doped with a first dopant. The first conductive semiconductor layer 120 may be made of semiconductor materials having a composition formula of $In_{x1}Al_{y1}Ga_{1-x1-y1}N$ ($0 \leftarrow x1 \leftarrow 1$, ($\leftarrow y1 \leftarrow 1$, and ($\leftarrow x1+y1 \leftarrow 1$), for example, semiconductor materials selected from among GaN, AlGaN, InGaN, InAlGaN, and the like.

The first dopant may be an n-type dopant such as Si, Ge, Sn, Se, and Te. When the first dopant is an n-type dopant, the first conductive semiconductor layer 120 doped with the first dopant may be an n-type semiconductor layer.

The first conductive semiconductor layer 120 may include a first superlattice layer 122 and a second superlattice layer 123. The first superlattice layer 122 may include a first sub layer 122a and a second sub layer 122b that are alternately disposed. The first sub layer 122a may include indium. As an example, the first sub layer 122a may include InN and the second sub layer 122b may include GaN, but the present invention is not necessarily limited thereto.

Both the first sub layer 122a and the second sub layer 122b may also include InGaN. In this case, the composition of InGaN in the first sub layer 122a and the composition of InGaN in the second sub layer 122b may be different from each other. For example, the composition of indium (In) in the first sub layer 122a may be higher than the composition of indium (In) in the second sub layer 122b.

The first sub layer 122a may have a thickness of 2 nm to 4 nm, and the second sub layer 122b may have a thickness of 20 nm to 40 nm. That is, the first sub layer 122a may be thinner than the second sub layer 122b.

The first superlattice layer 122 may be a semiconductor layer grown at a low temperature to form concavo-convex portions VI having a V-shaped cross section. The concavo-convex portions may relieve the strain of the first conductive semiconductor layer 120 and an active layer 130 and may prevent the dislocation from extending to the active layer 130 and a second conductive semiconductor layer 150, thereby improving the quality of the semiconductor device.

As an example, the first conductive semiconductor layer 120 may be grown at about 1000° C., and the first superlattice layer 122 may be grown at about 700° C. to form the concavo-convex portion. However, in this case, as shown in FIG. 3, there is a problem in that groove-shaped defects U1 are formed on the surface of the semiconductor layer at the periphery of the concavo-convex portion VI. Accordingly, the surface roughness of the active layer may be increased and the applied stress may be increased. Thus, optical power may be lowered.

On the other hand, referring to FIG. 4, in the semiconductor device according to the embodiment, it can be seen that the density of the concavo-convex portions VI is maintained while the groove-shaped defects U1 are reduced by forming the first superlattice layer 122 on the first conductive semiconductor layer 120. That is, according to the embodiment, by forming the first superlattice layer 122 on the first conductive semiconductor layer 120, the surface morphology of the semiconductor layer and the stress of the active layer 130 may be controlled before growing the active layer 130. Accordingly, optical and electrical characteristics of the semiconductor device may be improved.

Referring to FIG. 1 again, the first sub layer 122a and the second sub layer 122b may be doped with a first dopant. The first dopant may be an n-type dopant such as Si, Ge, Sn, Se, and Te. When the first dopant is an n-type dopant, the first sub layer 122a and the second sub layer 122b, which are doped with the first dopant, may be n-type semiconductor layers.

A doping concentration of the first sub layer 122a may be higher than a doping concentration of the second sub layer 122b. When both the first sub layer 122a and the second sub layer 122b are sufficiently doped with the first dopant, it may be beneficial for electrostatic discharge (ESD), but a reverse voltage VR may be lowered significantly. Accordingly, in the embodiment, capacitance may be increased without significantly lowering the level of the reverse voltage VR by further doping the first dopant into the first sub layer 122a that is thinner than the second sub layer 122b, thereby achieving ESD improvement. As an example, the first sub layer 122a may have a doping concentration of $2\times10^{18}$ cm$^{-3}$ to $3\times10^{18}$ cm$^{-3}$, and the second sub layer 122b may have a doping concentration of $0.5\times10^{18}$ cm$^{-3}$ to $1.5\times10^{18}$ cm$^{-3}$, but the present invention is not necessarily limited thereto.

The second superlattice layer 123 may include a third sub layer 123a and a fourth sub layer 123b that are alternately disposed. The third sub layer 123a may include InGaN, and the fourth sub layer 123b may include AlGaN. The second superlattice layer 123 may serve to relieve the stress of the active layer 130 and to spread current.

The active layer 130 may be disposed between the first conductive semiconductor layer 120 and the second conductive semiconductor layer 150. The active layer 130 is a layer at which electrons (or holes) injected through the first conductive semiconductor layer 120 and holes (or electrons) injected through the second conductive semiconductor layer 150 meet. As the electrons and the holes are recombined and transitioned to a low energy level, the active layer 130 may generate light.

According to the embodiment, before the active layer 130 is grown, the surface roughness is improved due to the first superlattice layer 122 so that the stress applied to the active layer 130 may be relieved to enhance optical power.

The active layer 130 may have one structure among a single well structure, a multi-well structure, a single quantum well structure, a multi-quantum well (MQW) structure, a quantum dot structure, and a quantum wire structure, but the structure of the active layer 130 is not limited thereto. As an example, the active layer may generate blue light having a wavelength band of 450 nm, but the present invention is not necessarily limited thereto The second conductive semiconductor layer 150 may be formed on the active layer 130 and implemented with a compound semiconductor including a III-V group element, a II-VI group element, or the like, and the second conductive semiconductor layer 150 may be doped with a second dopant. The second conductive semiconductor layer 150 may be made of semiconductor materials having a composition formula of $In_{x5}Al_{y2}Ga_{1-x5-y2}N$ (($\leftarrow x5 \leftarrow 1$, ($\leftarrow y2 \leftarrow 1$, and ($\leftarrow x5+y2 \leftarrow 1$) or materials selected from among AlInN, AlGaAs, GaP, GaAs, GaAsP, and AlGaInP. When the second dopant is a p-type dopant such as Mg, Zn, Ca, Sr, Ba, or the like, the second conductive semiconductor layer 150 doped with the second dopant may be a p-type semiconductor layer.

A blocking layer 140 may be disposed between the active layer 130 and the second conductive semiconductor layer 150. The blocking layer 140 may block electrons supplied from the first conductive semiconductor layer 120 from flowing out to the second conductive semiconductor layer 150, thereby increasing the probability that electrons and holes are recombined with each other in the active layer 130. An energy band gap of the blocking layer 140 may be greater than an energy band gap of the active layer 130 and/or the second conductive semiconductor layer 150.

The blocking layer 140 may be selected from semiconductor materials having a composition formula of $In_{x1}Al_{y1}Ga_{1-x1-y1}N$ ((←x1←1, 0←y1 ←1, and (←x1+y1←1), for example, semiconductor materials selected from among AlGaN, InGaN, InAlGaN, and the like, but the present invention is not necessarily limited thereto.

Each of the first electrode 161 and the second electrode 162 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited thereto.

FIG. 5 illustrates secondary-ion mass spectrometry (SIMS) data of the semiconductor device according to one embodiment of the present invention, FIG. 6 is a view illustrating an ion intensity of each of a first dopant and indium, FIG. 7 is a view illustrating a doping concentration of each of a first dopant and a second dopant, and FIG. 8 is a view illustrating an ion intensity of aluminum.

Referring to FIG. 5, a semiconductor structure may include indium (In), aluminum (Al), gallium (Ga), a first dopant, and a second dopant each having a secondary ion intensity that changes in a first direction D1 that is a direction toward the second conductive semiconductor layer 150 from the first conductive semiconductor layer 120. A first dopant (dopant 1) may be silicon (Si), and a second dopant (dopant 2) may be magnesium (Mg), but the present invention is not necessarily limited thereto.

SIMS data may be data that is analyzed through Time-of-Flight Secondary Ion Mass Spectrometry (TOF-SIMS).

SIMS data may be obtained by analyzing secondary ions that are emitted from a target surface to which primary ions are irradiated. In this case, the primary ions may be selected from among $O_2^+$, $Cs^+$, $Bi^+$, and the like. As an example, an acceleration voltage may be adjusted within the range of 20 keV to 30 keV, an irradiated current may be adjusted within the range of 0.1 pA to 5.0 pA, and an area where the irradiation is achieved may be 20 nm×20 nm, but the present invention is not necessarily limited thereto.

SIMS data may be obtained by collecting a secondary ion mass spectrum while gradually etching a surface S0 (a point with a depth of zero) of the second conductive semiconductor layer 150 in a direction toward the first conductive semiconductor layer 120.

Also, results of the SIMS analysis may be obtained by interpreting a spectrum for a secondary ion intensity or doping concentration of the material. When the secondary ion intensity or doping concentration is interpreted, the results may include noise occurring within 0.9 times to 1.1 times. Accordingly, the term "the same/identical" refers to including noise within 0.9 times to 1.1 times of a specific secondary ion intensity or doping concentration.

The indium, the aluminum, and the gallium in the SIMS data are spectrum data for the ion intensity, and the first dopant and the second dopant are data obtained by calculating spectrum data for the doping concentration. That is, referring to FIGS. 5, 6, and 7, the first and second dopants may refer to concentration ($atoms/cm^3$) units, and the indium, the aluminum, and the gallium may refer to secondary ion intensity (counts/sec.) units.

The method of calculating the doping concentration data of the first dopant and the second dopant is not particularly limited. In addition, in the present embodiment, a longitudinal axis (i.e., a Y-axis) is converted to a logarithmic scale and illustrated.

The ion intensity according to the embodiment may increase or decrease depending on measurement conditions. However, a secondary ion intensity (e.g., for an aluminum ion) may generally increase on the graph when a primary ion intensity increases and may generally decrease on the graph when the primary ion intensity decreases. Accordingly, the change in ion intensity in a thickness (depth) direction may be similar even when the measurement conditions are changed.

Referring to FIGS. 6 and 7, an indium ion intensity may have a plurality of first indium intensity peaks N1 in a region of a plurality of first sub layers 122a, and a doping concentration of the first dopant may have a plurality of first concentration peaks S1 in the plurality of first sub layers 122a.

Further, in a plurality of second sub layers 122b, an indium ion intensity may have a plurality of first valleys N12, and a doping concentration of the first dopant may have a plurality of second valleys S12. Here, the first valleys N12 may increase in intensity as it goes in the first direction D1.

That is, the first indium intensity peaks N1 and the first concentration peaks S1 may be disposed at the same position, and the first valleys N12 and the second valleys S12 may also be disposed at the same position. In addition, the first concentration peak S1 may have a higher doping concentration than the second valley S12. According to such a configuration, the first dopant is intensively doped into the relatively thin first sub layer 122a, and thus ESD improvement may be achieved while preventing a reverse voltage level from being excessively lowered.

That is, the intensity of indium ions emitted from the plurality of first sub layers 122a may have the plurality of first indium intensity peaks N1, the doping concentration of the first dopant emitted from the plurality of first sub layers 122a may have the plurality of first concentration peaks S1, and the plurality of first indium intensity peaks N1 and the plurality of first concentration peaks S1 may be disposed between a third indium intensity peak N3 and a fifth concentration peak S5.

The indium ion intensity may have a second indium intensity peak N2 and the third indium intensity peak N3 that are disposed to be spaced apart from the first indium intensity peak N1 in the first direction D1. Here, the second indium intensity peak N2 and the third indium intensity peak N3 may have an ion intensity higher than that of the first indium intensity peak N1, and the third indium intensity peak N3 may have an ion intensity higher than that of the second indium intensity peak N2. The third indium intensity peak N3 may be the maximum indium intensity peak in a semiconductor structure.

The second indium intensity peak N2 may be an ion intensity in the second superlattice layer 123, and the third indium intensity peak N3 may be an indium ion intensity in the active layer 130. Accordingly, the number of the second indium intensity peaks N2 may be equal to the number of the third sub layers 123a of the second superlattice layer 123, and the number of the third indium intensity peak N3 may be equal to the number of well layers.

The doping concentration of the first dopant may include a second concentration peak S2 and a third concentration peak S3 disposed to be spaced apart from the first concentration peak S1 in the first direction D1. Here, the second concentration peak S2 and the third concentration peak S3 may be higher than the first concentration peak S1, and the second concentration peak S2 may be higher than the third concentration peak S3.

The second concentration peak S2 may be disposed in a region between the active layer 130 and the first conductive semiconductor layer 120. That is, the second concentration peak S2 may be disposed between the second indium intensity peak N2 and the third indium intensity peak N3. The second concentration peak S2 may have a relatively high doping concentration of the first dopant in order to increase the moving speed of first carriers. Accordingly, since the moving speed of the first carriers injected into the active layer 130 is increased, electron injection efficiency may be enhanced and optical power may be improved.

The first dopant may further include a fourth concentration peak S4 and the fifth concentration peak S5 disposed to be spaced apart from each other in a direction opposite to the first direction D1. The fifth concentration peak S5 may be the maximum concentration peak among the doping concentrations of the first dopant.

The fourth concentration peak S4 may have an ion intensity lower than that of the fifth concentration peak S5 and higher than that of the first concentration peak S1. According to the embodiment, the intensity of the first dopant is lowered in the region in which the fourth concentration peak S4 is disposed so that operating voltage improvement may be achieved.

The doping concentration of the second dopant may be highest on a surface S0 and may gradually decrease away from the surface. In addition, the second dopant may have a reverse section (a section between M1 and M2) in which the concentration increases away from the surface.

The second dopant may be present in all regions of the second conductive semiconductor layer 150 and some regions of the active layer 130, but the present invention is not necessarily limited thereto. The second dopant may be disposed in only the second conductive semiconductor layer 150 but may diffuse up to the active layer 130. Accordingly, it is possible to improve injection efficiency for the second dopant injected into the active layer 130. However, when the second dopant diffuses up to the first conductive semiconductor layer 120, a leakage current of the semiconductor device and/or non-radiative recombination between first and second carriers may occur, thereby reducing reliability and/or light-emitting efficiency of the semiconductor device.

Referring to FIG. 6, the third indium intensity peak N3 having the highest indium ion intensity and the fifth concentration peak S5 having the highest concentration of the first dopant may be disposed to be spaced apart from each other in the first direction D1. A reference region R5 including the third indium intensity peak N3 may be the active layer.

The reference region R5 may further include a plurality of sections in which an indium ion intensity increases and decreases in the first direction and/or the direction opposite to the first direction with respect to the third indium intensity peak N3, and it has a high point and a low point at points at which the increasing section and the decreasing section are in contact.

When the active layer is composed of a plurality of well layers and a plurality of blocking layers, the plurality of well layers may each be the high point having a high indium ion intensity, and the plurality of blocking layers may each be the low point having a low indium ion intensity. In addition, the high and low points of the active layer may each have an ion intensity within 10% error relative to the third indium intensity peak N3. Thus, energy band gaps of the well layers may be configured relatively uniformly, and the wavelength of light emitted from each of the well layers may be uniformly controlled.

A first region R1 including the fifth concentration peak S5, which has the highest first dopant concentration, may include a point at which the indium ion intensity is the lowest (or a point serving as a reference for the indium ion intensity). Accordingly, the stress between the active layer and the substrate may be relieved while having a high first carrier concentration.

The first region R1 may have a first dopant concentration similar to that of the fifth concentration peak S5. Specifically, the doping concentration in the first region R1 and the fifth concentration peak S5 may have a relatively uniform concentration within 5% error. Accordingly, the stress generated between the substrate and the active layer may be relieved and crystal defects may be improved by configuring the indium ion intensity between the active layer and the first region R1 to be low. Here, the phrase "the indium ion intensity is lowered" may mean that the indium ion intensities of a plurality of high and/or low points are steadily lowered or gradually lowered.

A second region R2 may be disposed between the reference region R5 and the first region R1, and the second region R2 may be disposed in contact with the first region R1. The second region R2 may have a relatively uniform concentration within 5% error relative to the fourth concentration peak S4. In addition, the second region R2 may have an indium ion intensity similar to the indium ion intensity of the first region R1. The second region R2 has a dopant concentration lower than the first dopant concentration of the first region R1, thereby improving a diffusion function of the first carriers.

A third region R3 may be disposed between the reference region R5 and the second region R2. The third region R3 may be disposed in contact with the second region R2. The third region R3 may have a plurality of sections in which the indium ion intensity increases along the first direction D1 and a plurality of sections in which the indium ion intensity decreases along the first direction D1, and each of the plurality of increasing sections and each of the plurality of decreasing sections may be in contact with each other. Accordingly, the indium ion intensity may have a plurality of peaks N1 and a plurality of valleys N12 in the third region R3.

In addition, a first dopant concentration of the third region R3 may have a plurality of increasing sections and a plurality of decreasing sections along the first direction D1, and each of the plurality of increasing sections and each of the plurality of decreasing sections may be in contact with each other. Accordingly, the first dopant concentration may have a plurality of peaks S1 and a plurality of valleys S12 in the third region R3.

A high point of the first dopant in the third region R3 may be disposed between the section in which the indium ion intensity of the third region R3 increases along the first direction and the section in which the indium ion intensity of the third region R3 decreases along the first direction. In addition, the high point of the first dopant in the third region R3 may be disposed in the same region as a high point of the indium ion intensity of the third region R3. In this case, ESD improvement may be achieved while preventing a reverse voltage level from being excessively lowered.

The plurality of peaks N1 of the indium ion intensity in the third region R3 may have a relatively uniform ion intensity within 10%. In addition, the plurality of valleys N12 of the indium ion intensity in the third region R3 may have a higher indium ion intensity in the first direction. In addition, the difference between the peak N1 and the valley N12 of the indium ion intensity, which are closest to each other, may gradually decrease along the first direction D1. Accordingly, the stress generated due to the difference between a lattice constant of the substrate and/or the first region R1 and a lattice constant of the active layer may be relieved.

A region in which the first region R1 is in contact with the second region R2 may have a first slope SP1, which is an average change amount of the first dopant concentration with respect to a depth change amount, between the first dopant concentration of the first region R1 and the first dopant concentration of the second region R2.

Also, a region in which the second region R2 is in contact with the third region R3 may have a second slope SP2, which is an average change amount of the first dopant concentration with respect to a depth change amount, between the first dopant concentration of the second region R2 and the first dopant concentration of the third region R3.

The first slope SP1 may be gentler than the second slope SP2. Accordingly, the difference in the amount of change of the first carriers between the first region R1 and the second region R2 may be minimized as much as possible, and the difference in the electric field due to the change amount of the first carriers is reduced so that internal electric field may be reduced, thereby suppressing a phenomenon in which a wavelength changes according to the internal electric field.

A fourth region R4 may be disposed between the third indium intensity peak N3 and the third region R3. The fourth region R4 may have a plurality of sections in which an indium ion intensity decreases along the first direction and a plurality of sections in which the indium ion intensity increases along the first direction, and a peak point including a high point and/or a low point may be included in a region in which each of the plurality of sections in which the indium ion intensity decreases is in contact with each of the plurality of sections in which the indium ion intensity increases.

The low point of the fourth region R4 may be higher than the high point of the third region R3 and may be lower than the ion intensity peak of the active layer. Accordingly, the stress caused by a lattice constant difference between the substrate and the active layer and/or between the active layer and the third region R3 may be relieved. In addition, a distance between the high point and the low point of the indium ion intensity adjacent to each other in the fourth region R4 may be less than a distance between the high point and the low point of the indium ion intensity adjacent to each other in the third region R3. Thus, crystal defects extending from the third region R3 to the active layer may be reduced, and the crystal quality of the active layer may be improved, thereby improving optical power and electrical characteristics of a light-emitting device.

The fourth region R4 and the reference region R5 may be in contact with each other, and a region in which the fourth region R4 is in contact with the reference region R5 may have a first dopant concentration that is higher than the first dopant concentration of the second region R2 and lower than the first dopant concentration of the first region R1. In addition, the first dopant concentration of the region in which the fourth region R4 is in contact with the reference region R5 may have increasing sections and decreasing sections along the first direction, and a contact point at which the two sections are in contact with each other may be the second concentration peak S2. Accordingly, the optical power of the light-emitting device may be improved by increasing the concentration of the first carriers injected into the active layer.

According to the embodiment, the first region R1 and the second region R2 may be regions corresponding to the first conductive semiconductor layer, the third region R3 may be a region corresponding to the first superlattice layer, the fourth region R4 may be a region corresponding to the second superlattice layer, the reference region R5 may be a region corresponding to the active layer, and a sixth region R6 may be a region corresponding to the second conductive semiconductor layer and the blocking layer.

Referring to FIGS. 5 and 8, an aluminum ion intensity may include a first aluminum peak A1 having the highest ion intensity and a second aluminum peak A2 disposed to be spaced apart from the first aluminum peak A1 in the direction opposite to the first direction. The first aluminum peak A1 may be disposed in a region of the blocking layer 140, and the second aluminum peak A2 may be disposed in the superlattice layer. Accordingly, the third indium intensity peak N3 disposed in the region of the active layer 130 may be disposed between the first aluminum peak A1 and the second aluminum peak A2.

The second indium intensity peak N2 and the second aluminum peak A2 may be disposed at the same position of the second superlattice layer 123.

The first indium intensity peak N1 may be disposed between the third indium intensity peak N3 having the highest indium ion intensity and the fifth concentration peak S5 having the highest first dopant concentration. In addition, the first indium intensity peak N1 may be disposed between the fifth concentration peak S5 and the second indium intensity peak N2 that is disposed at the same position as the second aluminum peak A2. The number of first indium intensity peaks N1 may be plural.

The first concentration peak S1 may be disposed at the same position (depth) as the first indium intensity peak N1. The first indium intensity peaks N1 and the first valleys N12 may be alternately disposed, and the first concentration peaks S1 and the second valleys S12 may be alternately disposed. Here, the first valley N12 and the second valley S12 may be disposed at the same position (depth).

FIG. 9 is a graph obtained by measuring optical power of the semiconductor device according to one embodiment of the present invention, FIG. 10 is a graph obtained by measuring voltage and current applied to the semiconductor device according to one embodiment of the present invention, FIG. 11 is a graph obtained by measuring external light extraction efficiency of the semiconductor device according to one embodiment of the present invention, and FIG. 12 is a graph obtained by measuring wall-plug efficiency (WPE) of the semiconductor device according to one embodiment of the present invention.

Referring to FIG. 9, it can be seen that the embodiment in which the first sub layer 122a and the second sub layer 122b are disposed has an optical power Po increased compared to a conventional semiconductor device. In addition, it can be seen that current-voltage characteristics are improved as shown in FIG. 10, external light extraction efficiency is also improved as shown in FIG. 11, and WPE is also improved as shown in FIG. 12.

The semiconductor device may be applied to various types of light source devices. For example, the light source devices may be concepts including a lighting device, a display device, and a vehicle lamp. That is, the semiconductor device may be disposed in a case and applied to various electronic devices configured to provide light.

The lighting device may include a light source module having the substrate 110 and the semiconductor device of the embodiment, a heat dissipation part configured to dissipate heat of the light source module, and a power supply configured to process or convert an electrical signal provided from the outside to provide the electrical signal to the light source module. In addition, the lighting device may include a lamp, a head lamp, a street light, or the like.

The display device may include a bottom cover, a reflective plate, a light-emitting module, a light guide plate, an optical sheet, a display panel, an image signal output circuit, and a color filter. The bottom cover, the reflective plate, the light-emitting module, the light guide plate, and the optical sheet may constitute a backlight unit.

The reflective plate may be placed on the bottom cover, and the light-emitting module may emit light. The light guide plate may be placed in front of the reflective plate to guide light emitted by the light-emitting module forward, and the optical sheet may include a prism sheet or the like and may be placed in front of the light guide plate. The display panel may be placed in front of the optical sheet, the image signal output circuit may supply an image signal to the display panel, and the color filter may be placed in front of the display panel.

When the semiconductor device is used as a backlight unit of a display device, the semiconductor device may be used as an edge-type backlight unit or a direct-type backlight unit.

The semiconductor device may be a laser diode in addition to the above-described light-emitting diode.

Like the light-emitting device, the laser diode may include a first conductive semiconductor layer 120, an active layer 130, and a second conductive semiconductor layer 150 that have the above-described structures. In addition, the laser diode may utilize an electroluminescence phenomenon in which light is emitted when current flows after bonding a p-type first conductive semiconductor and an n-type second conductive semiconductor, but has a difference in the directionality and phase of the emitted light. That is, the laser diode uses stimulated emission and constructive interference phenomena so that light having a specific single wavelength (monochromatic beam) may be emitted at the same phase and in the same direction. Due to these characteristics, the laser diode may be used for an optical communication or medical device, a semiconductor processing device, or the like.

A light-receiving device may include, for example, a photodetector, which is a kind of transducer configured to detect light and convert the intensity of the light into an electric signal. Such a photodetector includes a photocell (silicon or selenium), a photoconductor element (cadmium sulfide or cadmium selenide), a photodiode (PD) (for example, a PD having a peak wavelength in a visible blind spectral region or a true blind spectral region), a phototransistor, a photomultiplier tube, a phototube (vacuum or gas-filled), an infra-red (IR) detector, and the like, but the embodiment is not limited thereto.

In addition, the semiconductor device such as the photodetector may generally be manufactured using a direct bandgap semiconductor having a high photoconversion efficiency. Alternatively, the photodetector has various structures and the most common structure may include a pin-type photodetector using a p-n junction, a Schottky-type photodetector using a Schottky junction, a metal-semiconductor-metal (MSM)-type photodetector, or the like.

Like the light-emitting device, the photodiode may include a first conductive semiconductor layer 120, an active layer 130, and a second conductive semiconductor layer 150 that have the above-described structures and may be formed as a p-n junction or pin structure. The photodiode operates when a reverse bias or a zero bias is applied, and when light is incident on the photodiode, electrons and holes are generated such that current flows. In this case, the magnitude of current may be approximately proportional to the intensity of light incident on the photodiode.

A photocell or a solar cell, which is a kind of photodiode, may convert light into current. Like the light-emitting device, the solar cell may include a first conductive semiconductor layer 120, an active layer 130, and a second conductive semiconductor layer 150 that have the above-described structures.

Also, the solar cell may be used as a rectifier of an electronic circuit through the rectification characteristics of a general diode using a p-n junction and may be applied to an ultra-high frequency circuit and then an oscillation circuit or the like.

Also, the above-described semiconductor device is not necessarily implemented only with semiconductors, and may further include a metal material in some cases. For example, the semiconductor device such as a light-receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

While the embodiments have been mainly described, they are only examples but do not limit the present invention, and it may be known to those skilled in the art that various modifications and applications, which have not been described above, may be made without departing from the essential properties of the embodiments. For example, the specific components described in the embodiments may be implemented while being modified. In addition, it will be interpreted that differences related to the modifications and applications fall within the scope of the present invention defined by the appended claims.

The invention claimed is:
1. A semiconductor device comprising:
  a semiconductor structure including a first conductive semiconductor layer, a second conductive semiconductor layer, and an active layer configured to emit light and disposed between the first conductive semiconductor layer and the second conductive semiconductor layer,
  wherein the first conductive semiconductor layer includes a first superlattice layer including a plurality of first sub layers and a plurality of second sub layers, and individual first sublayer of the plurality of first sub layers and individual second sublayer of the plurality of second sub layers are alternately disposed,
  wherein the first conductive semiconductor layer further includes a second superlattice layer disposed between the active layer and the first superlattice layer,
  wherein the first sub layer includes a composition of indium,
  wherein a maximum doping concentration of a first dopant in each of the plurality of first sub layers is different from a maximum doping concentration of the first dopant in each of the plurality of second sub layers, and a concentration of indium in each of the plurality of first sub layers is higher than a concentration of indium in each of the plurality of second sub layers,
  wherein a concentration of indium in the active layer is higher than a concentration of indium in the second superlattice layer, and the concentration of indium in the second superlattice layer is higher than a concentration of indium in the first superlattice layer, and wherein a portion of the first conductive semiconductor layer that is between the substrate and the first superlattice layer includes the highest doping concentration of the first dopant in the semiconductor device.

2. The semiconductor device of claim 1, wherein
the first conductive semiconductor layer includes a second superlattice layer disposed between the active layer and the first superlattice layer,
the second superlattice layer includes a third sub layer and a fourth sub layer, which are alternately disposed, and
a concentration of indium in the third sub layer is higher than a concentration of indium in the first sub layer.

3. The semiconductor device of claim 1, wherein
the plurality of first sub layer include InN, and
the plurality of second sub layer includes GaN.

4. The semiconductor device of claim 3, wherein
each of the plurality of first sub layers has a thickness of 2 nm to 4 nm, and
each of the plurality of second sub layers has a thickness of 20 nm to 40 nm.

5. The semiconductor device of claim 1, wherein the plurality of first sub layers and the plurality of second sub layers all include InGaN.

6. The semiconductor device of claim 5, wherein a composition of InGaN in the first sub layer and a composition of InGaN in the second sub layer are different from each other.

7. The semiconductor device of claim 1, wherein each of the plurality of first sub layers is thinner than each of the plurality of the second sub layers.

8. The semiconductor device of claim 1, further comprising a substrate on which the semiconductor structure is disposed,
wherein the active layer includes the highest concentration of indium,
wherein the first conductive semiconductor layer includes a first region and a second region disposed on the first region, the first region and the second region disposed between the substrate and the first superlattice layer,
wherein the first region includes the highest doping concentration of the first dopant in the semiconductor device, and
wherein the second region includes a doping concentration of the first dopant which is less than the highest doping concentration of the first dopant in the first region and higher than the doping concentration of the first dopant in each of the plurality of first sub layers.

9. The semiconductor device of claim 2, wherein
a doping concentration of the first dopant in the first superlattice layer and a doping concentration of the first dopant in the second superlattice layer are less than the highest doping concentration of the first dopant in the first conductive semiconductor layer, and
the doping concentration of the first dopant in a region between the second superlattice layer and the active layer is greater than the doping concentration of the first dopant in the first superlattice layer.

10. The semiconductor device of claim 1, wherein each of the plurality of first sub layers has a thickness of 2 nm to 4 nm, and each of the plurality of second sub layers has a thickness of 20 nm to 40 nm.

11. The semiconductor device of claim 1, wherein
the second superlattice layer includes a third sub layer and a fourth sub layer, which are alternately disposed, and
a concentration of indium in the third sub layer is higher than a concentration of indium in the fourth sub layer, and
the concentration of indium in the third sub layer is less than the concentration of indium in the active layer and greater than the concentration of indium in each of the plurality of first sub layers.

12. The semiconductor device of claim 1, further comprising:
a blocking layer disposed between the active layer and the second conductive semiconductor layer,
wherein
the blocking layer includes the highest concentration of aluminum in the semiconductor device, and
the second superlattice layer includes the second highest concentration of aluminum in the semiconductor device.

* * * * *